(12) United States Patent
Marathe et al.

(10) Patent No.: US 7,033,940 B1
(45) Date of Patent: Apr. 25, 2006

(54) METHOD OF FORMING COMPOSITE BARRIER LAYERS WITH CONTROLLED COPPER INTERFACE SURFACE ROUGHNESS

(75) Inventors: Amit Marathe, Milpitas, CA (US); Connie Pin-Chin Wang, Menlo Park, CA (US); Christy Mei-Chu Woo, Cupertino, CA (US); Paul L. King, Mountain View, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 28 days.

(21) Appl. No.: 10/811,866

(22) Filed: Mar. 30, 2004

(51) Int. Cl.
*H01L 21/44* (2006.01)

(52) U.S. Cl. .................... 438/687; 438/627; 438/637; 438/643

(58) Field of Classification Search ............... 438/687
See application file for complete search history.

(56) References Cited

U.S. PATENT DOCUMENTS

2003/0089597 A1\* 5/2003 Tang et al. ............ 204/192.15
2005/0118796 A1\* 6/2005 Chiras et al. ............... 438/618

\* cited by examiner

*Primary Examiner*—Thanh Nguyen

(57) ABSTRACT

A composite α-Ta/graded tantalum nitride/TaN barrier layer is formed in Cu interconnects with a controlled surface roughness for improved adhesion, electromigration resistance and reliability. Embodiments include lining a damascene opening, such as a dual damascene opening in a low-k interlayer dielectric, with an initial layer of TaN, forming a graded tantalum nitride layer on the initial TaN layer and then forming an α-Ta layer on the graded TaN layer, the composite barrier layer having an average surface roughness (Ra) of about 25 Å to about 50 Å. Embodiments further include controlling the surface roughness of the composite barrier layer by varying the $N_2$ flow rate and/or ratio of the thickness of the combined α-Ta and graded tantalum nitride layers to the thickness of the initial TaN layer.

8 Claims, 5 Drawing Sheets

METHOD OF FORMING COMPOSITE BARRIER LAYERS WITH CONTROLLED COPPER INTERFACE SURFACE ROUGHNESS

TECHNICAL FIELD

The present invention relates to copper (Cu) and/or Cu alloy metallization in semiconductor devices, and to a method for manufacturing semiconductor devices with reliable, low resistance Cu or Cu alloy interconnects. The present invention is particularly applicable to manufacturing high speed integrated circuits having submicron design features and high conductivity interconnect structures.

BACKGROUND ART

The escalating requirements for high density and performance associated with ultra large scale integration semiconductor wiring require responsive changes in interconnection technology. Such escalating requirements have been found difficult to satisfy in terms of providing reliable low R×C (resistance×capacitance) interconnect patterns with higher electromigration resistance.

Conventional semiconductor devices comprise a semiconductor substrate, typically doped monocrystalline silicon, and a plurality of sequentially formed interlayer dielectrics and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization is becoming more prevalent as device geometry's shrink to submicron levels.

A conductive plug filling a via hole is typically formed by depositing an interlayer dielectric on a conductive layer comprising at least one conductive pattern, forming an opening through the interlayer dielectric by conventional photolithographic and etching techniques, and filling the opening with a conductive material, such as tungsten (W). Excess conductive material on the surface of the interlayer dielectric is typically removed by chemical mechanical polishing (CMP). One such method is known as damascene and basically involves forming an opening in the interlayer dielectric and filling the opening with a metal. Dual damascene techniques involve forming an opening comprising a lower contact or via hole section in communication with an upper trench section, which opening is filled with a conductive material, typically a metal, to simultaneously form a conductive plug in electrical contact with a conductive line.

High performance microprocessor applications require rapid speed of semiconductor circuitry. The control speed of semiconductor circuitry varies inversely with the resistance and capacitance of the interconnection pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. As the length of metal interconnects increases and cross-sectional areas and distances between interconnects decrease, the R×C delay caused by the interconnect wiring increases. If the interconnection node is routed over a considerable distance, e.g., hundreds of microns or more as in submicron technologies, the interconnection capacitance limits the circuit node capacitance loading and, hence, the circuit speed. As design rules are reduced to about 0.15 micron and below, e.g., about 0.12 micron and below, the rejection rate due to integrated circuit speed delays significantly reduces production throughput and increases manufacturing costs. Moreover, as line widths decrease electrical conductivity and electromigration resistance become increasingly important.

Cu and Cu alloys have received considerable attention as a candidate for replacing Al in interconnect metallizations. Cu is relatively inexpensive, easy to process, and has a lower resistively than Al. In addition, Cu has improved electrical properties vis-à-vis W, making Cu a desirable metal for use as a conductive plug as well as conductive wiring.

An approach to forming Cu plugs and wiring comprises the use of damascene structures employing CMP. However, due to Cu diffusion through inter dielectric layer materials, such as silicon dioxide, Cu interconnect structures must be encapsulated by a diffusion barrier layer. Typical diffusion barrier metals include tantalum (Ta), tantalum nitride (TaN), titanium nitride (TiN), titanium (Ti), titanium-tungsten (TiW), tungsten (W), tungsten nitride (WN), Ti-TiN, titanium silicon nitride (TiSiN), tungsten silicon nitride (WSiN), tantalum silicon nitride (TaSiN) and silicon nitride for encapsulating Cu. The use of such barrier materials to encapsulate Cu is not limited to the interface between Cu and the dielectric interlayer, but includes interfaces with other metals as well.

In implementing Cu metallization, particularly in damascene techniques wherein an opening is formed in a dielectric layer, particularly a dielectric layer having a low dielectric constant, e.g., a dielectric constant less than about 3.9, various reliability, electromigration and resistance issues are generated. Reliability issues stem, in part, from the use of Ta or TaN, the barrier layers of choice in Cu metallization. Ta has been found to lack adequate adhesion to various interlayer dielectric materials, particularly, interlayer dielectric materials having a low dielectric constant, e.g., a dielectric constant (k) less than about 3.9. TaN has been found to lack adequate adhesion to Cu and Cu alloys filling a damascene opening. Moreover, Ta and TaN are typically deposited by physical vapor deposition (PVD) techniques, such as ionized (I) PVD. The resulting layer of Ta is typically β-phase Ta or β-Ta which exhibits a relatively high resistivity, e.g., about 200 to about 250 μohm-cm. TaN is typically deposited with a nitrogen ($N_2$) content of about 30 to about 55 at. %, and exhibits a resistivity in excess of 200 μohm-cm.

The adhesion problems adversely impact electromigration resistance and device reliability, while the high resistivity of TaN and β-Ta manifestly adversely impact circuit speed. Accordingly, there exists a need for reliable, low resistance Cu and Cu alloy interconnects, particularly interconnects formed in low dielectric constant materials, and for enabling methodology.

DISCLOSURE OF THE INVENTION

An advantage of the present invention is a semiconductor device having low resistance Cu or Cu alloy interconnects exhibiting improved electromigration resistance and device reliability.

Another advantage of the present invention is a method of manufacturing a semiconductor device having low resistance Cu or Cu alloy interconnects with improved electromigration resistance and device reliability.

Additional advantages and other features of the present invention will be set forth in the description which follows and, in part, will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are achieved in part by a semiconductor device having a copper (Cu) or Cu alloy interconnect comprising: an opening formed in a dielectric layer; a composite barrier layer, comprising a layer of α-tantalum (α-Ta) over a tantalum nitride (TaN) layer, lining the opening; and Cu or a Cu alloy filling the opening and forming an interface with the composite barrier layer, wherein the composite barrier layer has an average surface roughness (Ra) at the interface with the Cu or Cu alloy of about 25A° to about 50A°.

Another advantage of the present invention is a method of manufacturing a semiconductor device, the method comprising: forming an opening in a dielectric layer over a semiconductor wafer; forming a composite barrier layer with an exposed surface having an average surface roughness (Ra) of about 25A° to about 50A° lining the opening, the composite barrier layer comprising a layer of α-tantalum (α-Ta) over an initial layer of tantalum nitride (TaN); and filling the opening with copper (Cu) or a Cu alloy.

Embodiments of the present invention comprise dual damascene interconnect structures comprising a lower Cu or Cu alloy via in electrical contact with a lower metal feature and connected to an upper Cu or Cu alloy line, wherein the dual damascene structure is formed in a dielectric layer or layers comprising a dielectric material having a dielectric constant less than about 3.9.

Embodiments of the present invention comprise controlling the average surface roughness (Ra) of the exposed surface of the composite barrier layer by varying: (a) the ratio of the thickness of the combined α-Ta and graded tantalum nitride layers to the thickness of the initial TaN layer; and/or (b) the $N_2$ flow rate during deposition of the initial TaN layer.

Additional advantages of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

DESCRIPTION OF THE INVENTION

Figure 1:
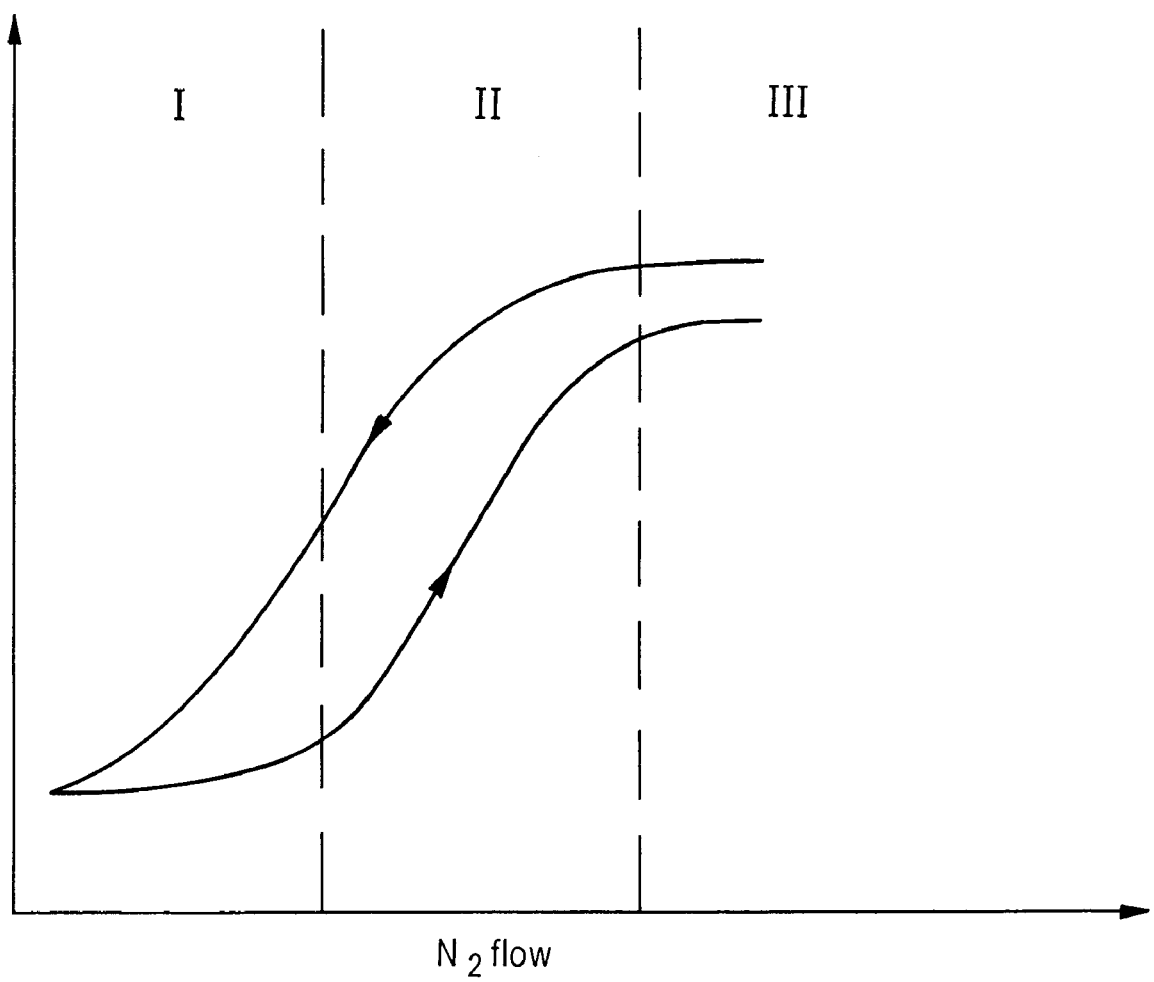
FIG. 1 illustrates a typical hysteresis curve during IPVD employing a Ta target and an $N_2$ flow.

The present invention addresses and solves various problems attendant upon forming Cu or Cu alloy interconnects, particularly, damascene structures in dielectric layer(s) comprising dielectric material having a dielectric constant (k) less than about 3.9. As employed throughout this application, the symbol Cu is intended to encompass high purity elemental copper as well as Cu-based alloys, such as Cu alloys containing minor amounts of tantalum, indium, tin, zinc, manganese, titanium, magnesium, chromium, titanium, germanium, strontium, platinum, magnesium, aluminum or zirconium.

As design rules are scaled down into the deep submicron range, such as about 0.12 micron and under, electromigration and contact resistance issues associated with Cu interconnects become increasingly significant. Reliability and electromigration issues stem, in part, from the poor adhesion of β-Ta to various low-k dielectric materials and poor adhesion of TaN to Cu and Cu alloys. TaN and β-Ta exhibit high resistivities, thereby adversely impacting circuit speed.

In U.S. patent application Ser. No. 09/874,255, filed on Jun. 6, 2001, now abandoned, such problems are addressed by providing a composite barrier layer comprising an initial TaN layer lining a damascene opening and a layer of α-Ta on the TaN layer, or by providing a composite barrier layer comprising a graded tantalum nitride layer between the initial TaN layer lining the damascene opening and the α-Ta layer. The formation of a composite barrier layer comprising an initial TaN layer in contact with dielectric material and a layer of α-Ta in contact with the Cu metallization solves adhesion issues generated by the poor adhesion of β-Ta to dielectric material and the poor adhesion of TaN to Cu metallization. It was found that upon depositing Ta on a layer of TaN, the TaN serves as a template for the growth of α-Ta, a low resistivity form of Ta, typically exhibiting a resistivity of about 40 to about 50 μohm-cm vis-à-vis about 200 to about 250 μohm-cm for β-Ta. It was found particularly advantageous to deposit both the composite barrier layers by IPVD, e.g., ionized sputter deposition (ISD). The initial layer of TaN is typically deposited at a thickness of about 25 Å to about 150 Å, e.g., about 50 Å to about 100 Å, while the layer of α-Ta is typically deposited at a thickness of about 100 to about 300 Å, e.g., about 200 Å to about 300 Å. The layer of TaN contains nitrogen at a concentration of about 30 to about 65 at. %, e.g., about 40 to about 55 at. %.

It should be understood that suitable deposition conditions are dependent upon the particular situation and can be optimized accordingly. It was found suitable, for example, to employ an argon (Ar) flow rate of about 40 to about 60 sccm, e.g., about 45 to about 60 sccm, a $N_2$ flow rate of about 10 to about 100 sccm, e.g., about 20 to about 70 sccm, a D.C. power of about 1,000 to about 40,000 watts, an RF power of about 1,000 to about 3,000 watts, and a pressure of about 1 to about 45 mTorr, depending upon the particular deposition system and technique. The TaN layer can be deposited for about 3 to about 20 sec., at which point the $N_2$ flow is turned off and a layer of α-Ta is deposited as for about 10 to about 30 sec.

The present invention constitutes a refinement of the methodology and resulting structure disclosed in abandoned application Ser. No. 09/874,255 by focusing upon improved electromigration performance. The present invention stems, in part, from the recognition that the dominant Cu diffusion path for electromigration is along the Cu/barrier layer interface at the bottom and side walls of a via electrically connecting upper and lower features, and in part from the recognition that Cu diffusion along this interface is heavily dependent upon, inter alia, the surface roughness of the Cu| barrier layer interface. An extremely smooth interface between the Cu inlay and barrier layer constitutes a rapid diffusion path and degrades electromigration performance. On the other hand, as the interface roughness increases, a shadowing effect occurs during subsequent deposition resulting in Cu discontinuities.

The present invention focuses upon improved electromigration resistance while avoiding the shadowing effect during subsequent Cu deposition by controlling the Cu/composite barrier layer interface roughness, as to an average surface roughness (Ra) of about 25 Å to about 50 Å. Embodiments of the present invention comprise depositing the composite barrier layer by controlling the $N_2$ flow between about 10 to about 100 sccm and/or controlling the ratio of the combined thickness of the $\alpha$-Ta and graded tantalum nitride layers to the thickness of the initial TaN layer to about 1:1 to about 6:1, to achieve a suitable average surface roughness (Ra) on the exposed surface of the $\alpha$-Ta layer of about 25 Å to about 50 Å, prior to Cu deposition. By controlling the interface roughness between the composite barrier layer and Cu metalization, as at an average surface roughness (Ra) of about 25 Å to about 50 Å, the dominant Cu diffusion path for electromigration is significantly reduced while preventing shadowing during subsequent Cu deposition, thereby enhancing device integrity.

In an embodiment of the present invention, a three barrier layer composite is formed comprising an initial layer of TaN, a graded layer of tantalum nitride on the initial TaN layer, and a layer of $\alpha$-Ta on the graded tantalum nitride layer. The graded tantalum nitride layer typically has a $N_2$ content which decreases from proximate the initial TaN layer formed lining the opening to about zero proximate the $\alpha$-Ta layer, and typically contains $\alpha$-Ta in an amount from about zero proximate initial TaN layer increasing to about 100% proximate the $\alpha$-Ta layer. The initial TaN layer typically has a $N_2$ content substantially corresponding to that of the initial TaN layer proximate the initial TaN layer, i.e., about 30 to about 65 at. % and decreases to about zero proximate the $\alpha$-Ta layer. The resistivity of the graded tantalum nitride layer depends upon the $N_2$ content and is typically about 200 to about 900 µohm-cm proximate the initial TaN layer decreasing toward the $\alpha$-Ta layer, e.g., about 20A° to about 300A°. The three barrier layer composite embodiment of the present invention typically has an overall thickness of about 50A° to about 500A°.

The three barrier layer composite embodiment of the present invention can be implemented by a strategic ISD deposition-technique in which the $N_2$ flow rate is increased to a level above that employed in conventional practices and yet achieves a desirable stable uniform deposition rate and enables the subsequent formation of the low resistivity $\alpha$-Ta layer. In FIG. 1 a typical hysteresis curve for ISD is illustrated with the abscissa denoting the $N_2$ flow rate and the ordinate denoting the target voltage. Conventional practices tend to employ a low $N_2$ flow rate operating in region I to maintain reactive deposition without poisoning the Ta target with $N_2$. It should be understood that Ar is also employed during ISD deposition, with $N_2$ being the reactive species. Region II is not consistent with conventional wisdom in that a small variation in the $N_2$ flow rate results in a large variation in $N_2$ target poisoning resulting in an unstable process causing drifts or variations in the deposition rate, such as variations in thickness and composition. The adverse impact of $N_2$ poisoning on target composition and target surface causing non-uniform deposition results in an uncontrolled process and adversely impacts product-to-product uniformity. Region III is, similarly, not consistent with conventional wisdom due to the high degree of $N_2$ target poisoning.

As disclosed in abandoned application Ser. No. 09/874,255, it was found that the use of a high $N_2$ flow rate, in excess of that conventionally employed, i.e., operating in region III, caused a sufficiently high degree of Ta target poisoning such that, upon discontinuing the flow of $N_2$ subsequent to deposition of the initial TaN layer, deposition conditions can be otherwise maintained to deposit a graded tantalum nitride layer and $\alpha$-Ta layer thereon, using the $N_2$-poisoned Ta target containing a surface layer of TaN. By continuing deposition conditions in the absence of flowing $N_2$, the $N_2$-poisoned Ta target is actually cleaned of $N_2$ to form the graded tantalum nitride layer having a decreasing $N_2$ content and increasing $\alpha$-Ta content across its thickness proceeding away from the initial TaN barrier layer. As deposition continues, a layer of essentially pure $\alpha$-Ta is formed on the graded tantalum nitride layer from the cleaned Ta target completing the three composite layer barrier. Experimental results confirmed that electromigration resistance is optimized by forming a three barrier layer composite comprising an initial TaN layer, a graded tantalum nitride layer thereon and an $\alpha$-Ta layer.

The mechanism underpinning the dramatic improvement in electromigration results achieved with the present invention is not known with certainty. However, it is believed that the formation of a composite barrier layer having a controlled average surface roughness (Ra) of about 25 Å to about 50 Å° significantly reduces Cu diffusion along the Cu/composite barrier at the bottom and sidewalls of the via, which is the dominant Cu diffusion path for electromigration, while avoiding shadowing during subsequent Cu deposition, thereby improving electromigration performance and device reliability. In addition, the formation of a graded tantalum nitride layer results in optimum adhesion between the $\alpha$-Ta layer and initial TaN layer and, by operating in region III, a desirable stable deposition is obtained yielding improved uniformity in composition and thickness. Thus, not only is electromigration resistance enhanced, but product-to-product uniformity significantly improved. In addition, the advantageous formation of an $\alpha$-Ta layer results in a significant reduction in contact resistance.

The deposition conditions used in forming the three barrier layer composite embodiment of the present invention are also dependent upon a particular situation and, hence, can be optimized accordingly. For example, it was found suitable to conduct ISD of the three barrier layer composite at an Ar flow rate of about 40 to about 60 sccm, e.g., about 45 to about 60 sccm, an RF power of about 1,000 to about 2,000 watts, and a pressure of about 20 to about 45 mTorr. During initial deposition of the TaN layer, a $N_2$ flow rate of about 10 to about 100 sccm, e.g., about 30 to about 70 sccm, may be employed. After deposition of the initial TaN layer, as after about 2 to about 10 seconds to a thickness of about 20 Å to about 100 Å, the $N_2$ flow rate is discontinued. The high $N_2$ flow rate employed during deposition of the initial TaN layer, e.g., about 30 to about 70 sccm, operates in range III (FIG. 3) and poisons the Ta target with $N_2$ forming a layer of TaN on the Ta target.

After stopping the $N_2$ flow, ISP deposition continues using the $N_2$-poisoned TaN target to sequentially form the graded tantalum nitride layer, which is typically deposited over a period of about 2 to about 10 seconds and to a thickness of about 10 Å to about 100 Å, and the $\alpha$-Ta layer, which is typically deposited over a period of about 5 to about 30 seconds and to a thickness of about 20 Å to about 300 Å, on the graded tantalum nitride layer. The surface roughness of the α-Ta layer may be controlled to an average surface roughness (Ra) of about 25 Å to about 50 Å by controlling the $N_2$ flow rate between about 30 to about 70 sccm during deposition of the initial TaN layer and/or by controlling the ratio of the thickness of the combined α-Ta and graded tantalum nitride layers to the thickness of the initial TaN layer between about 50 to about 250.

Advantageously, the bias power applied during deposition of the initial TaN layer, and/or during deposition of the subsequent graded tantalum nitride and α-Ta layers can be separately optimized. For example, an A.C. bias power of about zero to about 500 watts can be applied during deposition of the TaN layer, and an A.C. bias power of about 200 to about 400 watts can be applied during deposition of the graded tantalum nitride and α-Ta layers.

Figure 2:
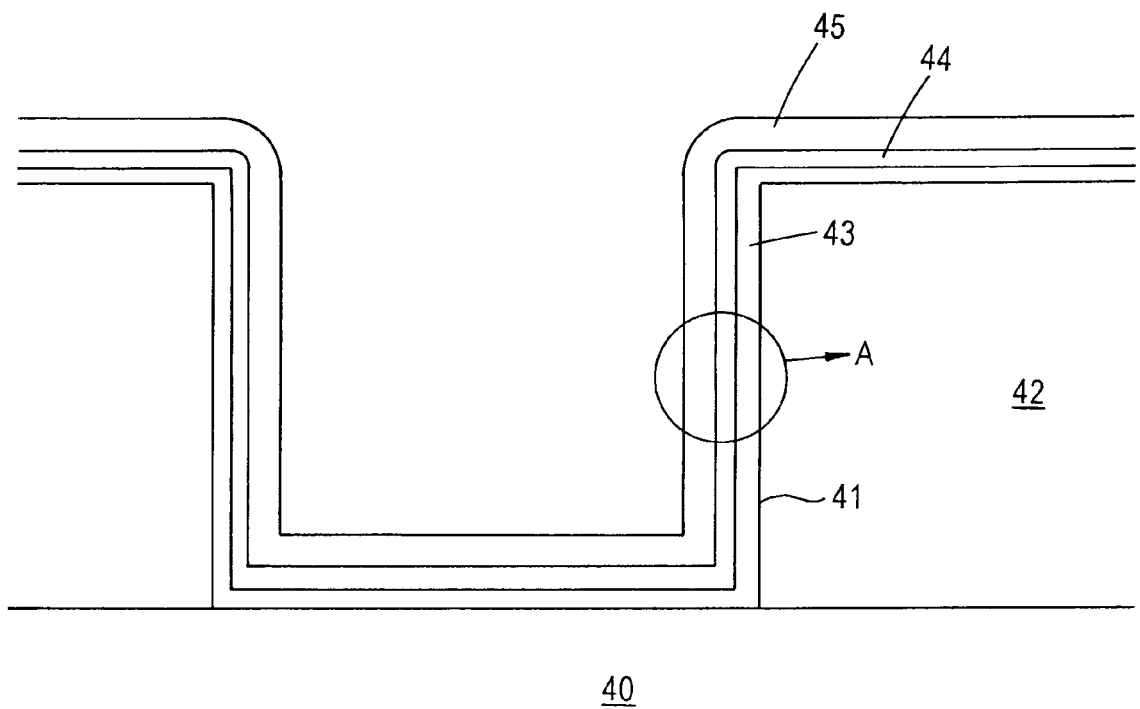
FIGS. 2 through 4 illustrate a single damascene embodiment in accordance with the present invention.
Figure 3:
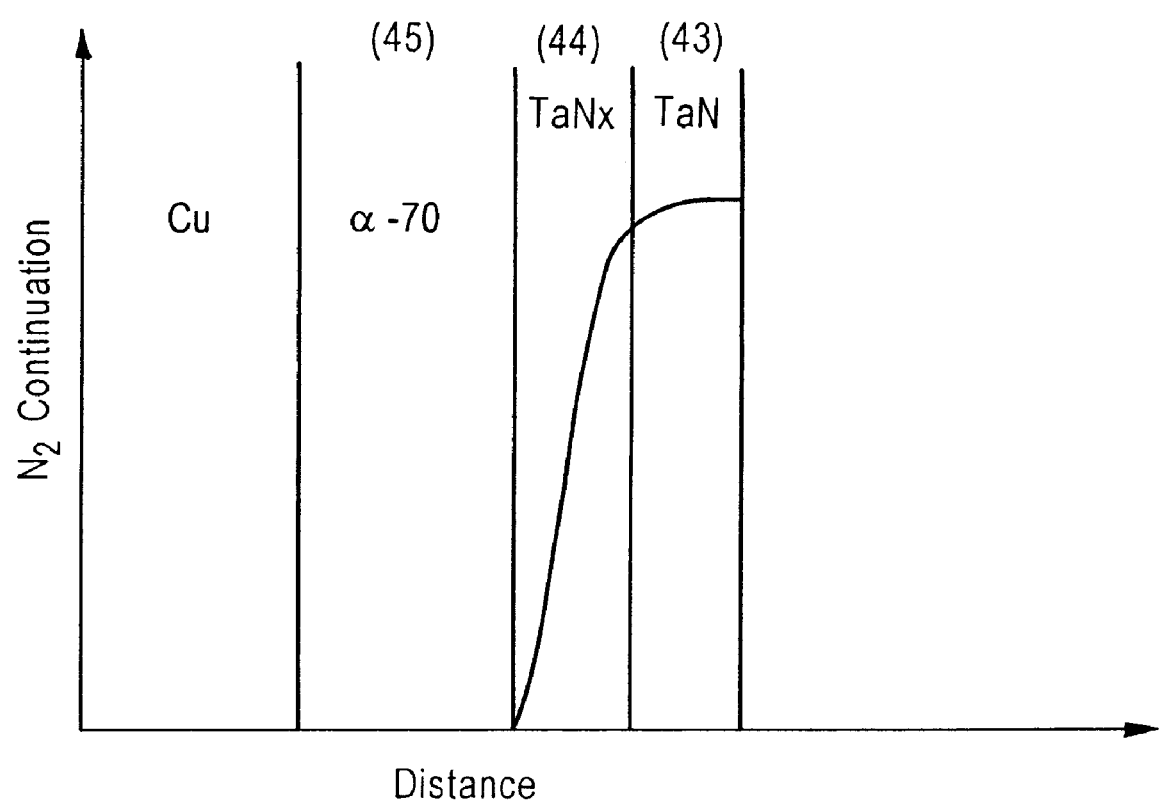
Figure 4:
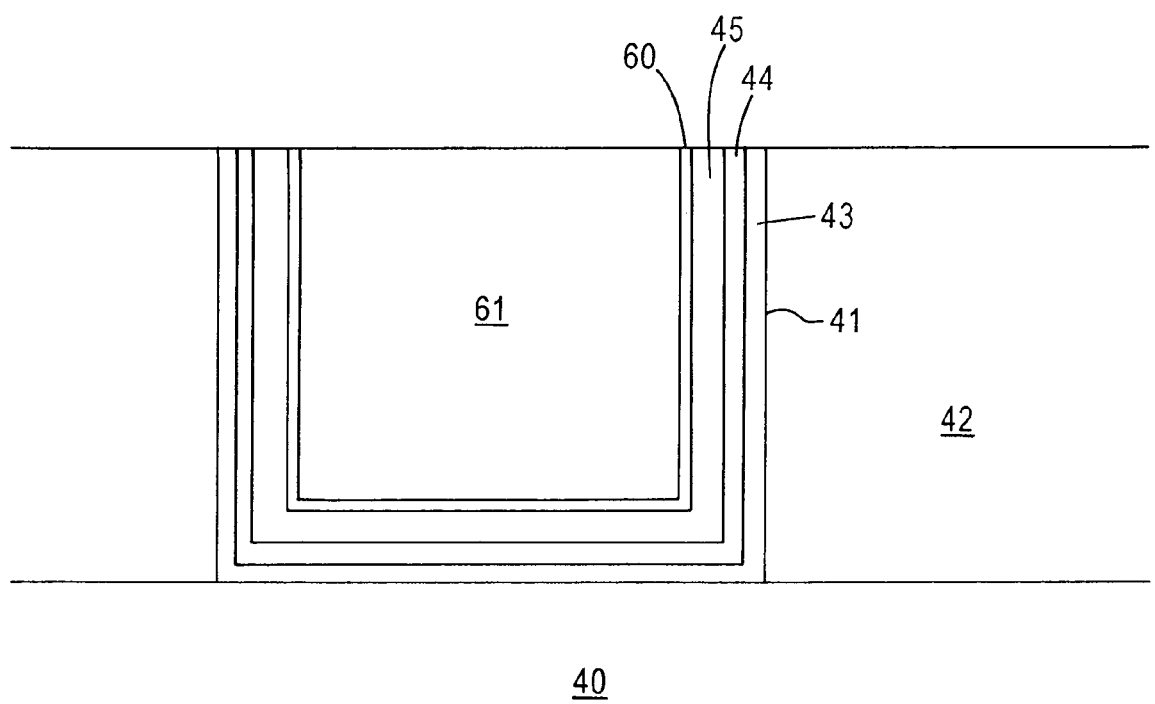

An embodiment of the present invention comprising a three barrier layer composite in Cu metallization to form a Cu line is schematically illustrated in FIGS. 2 through 4, wherein similar features or elements are denoted by similar reference numerals. Adverting to FIG. 2, a trench 41 is denoted by similar reference numerals. Adverting to FIG. 2, a trench 41 is formed in low-k interlayer dielectric 42 overlying layer 40, e.g., an interlayer dielectric. An initial TaN layer 43 is deposited on the side surfaces of low-k interlayer dielectric 42 defining trench 41. TaN layer 43 is deposited by ISD at a sufficiently high $N_2$ flow rate, e.g., about 30 to about 100 sccm, to poison the Ta target with $N_2$, forming a surface layer of TaN. The initial TaN layer 43 is typically deposited at a thickness of about 20 Å to about 100 Å. During deposition of the initial TaN layer 43, a bias power up to about 500 watts can be applied to the substrate.

After deposition of the initial TaN layer 43, the $N_2$ flow is shut off and ISD continues utilizing the $N_2$-poisoned Ta target. During such continued deposition using the $N_2$-poisoned Ta target without the flow of $N_2$, a graded tantalum nitride layer 44 is deposited and, during such continued deposition, the $N_2$-poisoned Ta target is cleaned, i.e., the surface layer of TaN is removed. During continued deposition an essentially pure α-Ta layer 45 is formed on graded tantalum nitride layer 44.

The $N_2$ flow rate during deposition of the initial TaN layer is controlled and/or the ratio of the thickness of the combined α-Ta and graded tantalum nitride layers to the thickness of the initial TaN layer is controlled such that the exposed surface of the α-Ta layer has an average surface roughness (Ra) of about 25 Å to about 50 Å, thereby significantly reducing Cu diffusion at the Cu/composite barrier layer interface with an attendant improvement in the electromigration resistance and device integrity.

Typically, the initial TaN layer 43 has a $N_2$ content of about 30 to 65 at. %, and the graded tantalum nitride layer 44 has a $N_2$ content of about 30 to 65 at. % proximate the initial TaN layer 43 decreasing to zero at proximate the α-Ta layer 45, while the concentration of α-Ta within the graded tantalum nitride 44 layer is about zero proximate the initial TaN 43 layer increasing to about 100% proximate the α-Ta layer 45. The graded tantalum nitride layer 44 has a resistivity of about 200 to about 900 μohm-cm at the initial TaN layer 43 decreasing toward the α-Ta layer 45. The α-Ta layer 45 exhibits a resistivity considerably lower than that of the conventionally deposited β-Ta layer. The resistivity of α-Ta layer 45 typically ranges from about 40 to about 50 μohm-cm, while the resistivity of a conventionally deposited α-Ta layer is typically about 200 to about 250 μohm-cm.

FIG. 3 represents an expanded view of region A of FIG. 2 showing the relatively constant $N_2$ content of the initial TaN layer 43 and the decreasing $N_2$ content of the graded tantalum nitride (TaN$_x$) layer 44. Also depicted are the Cu metallization and α-Ta layer 45.

Subsequently, a seedlayer 60 can be deposited on α-Ta layer 45, and the trench 41 is filled with Cu, as by electroless deposition or electroplating. CMP is then conducted to planarize the upper surface resulting in the structure schematically illustrated in FIG. 4 containing Cu line 61. The three barrier layer composite advantageously provides enhanced electromigration resistance, believed to be due in part to the superior adhesion between the initial TaN layer 43 and the low-k interlayer dielectric 42, superior adhesion between the α-Ta layer 45 and both the Cu metallization and the graded tantalum nitride layer 44, the graded tantalum nitride layer 44 enhancing adhesion between the α-Ta layer 45 and the initial TaN layer 43.

Figure 5:
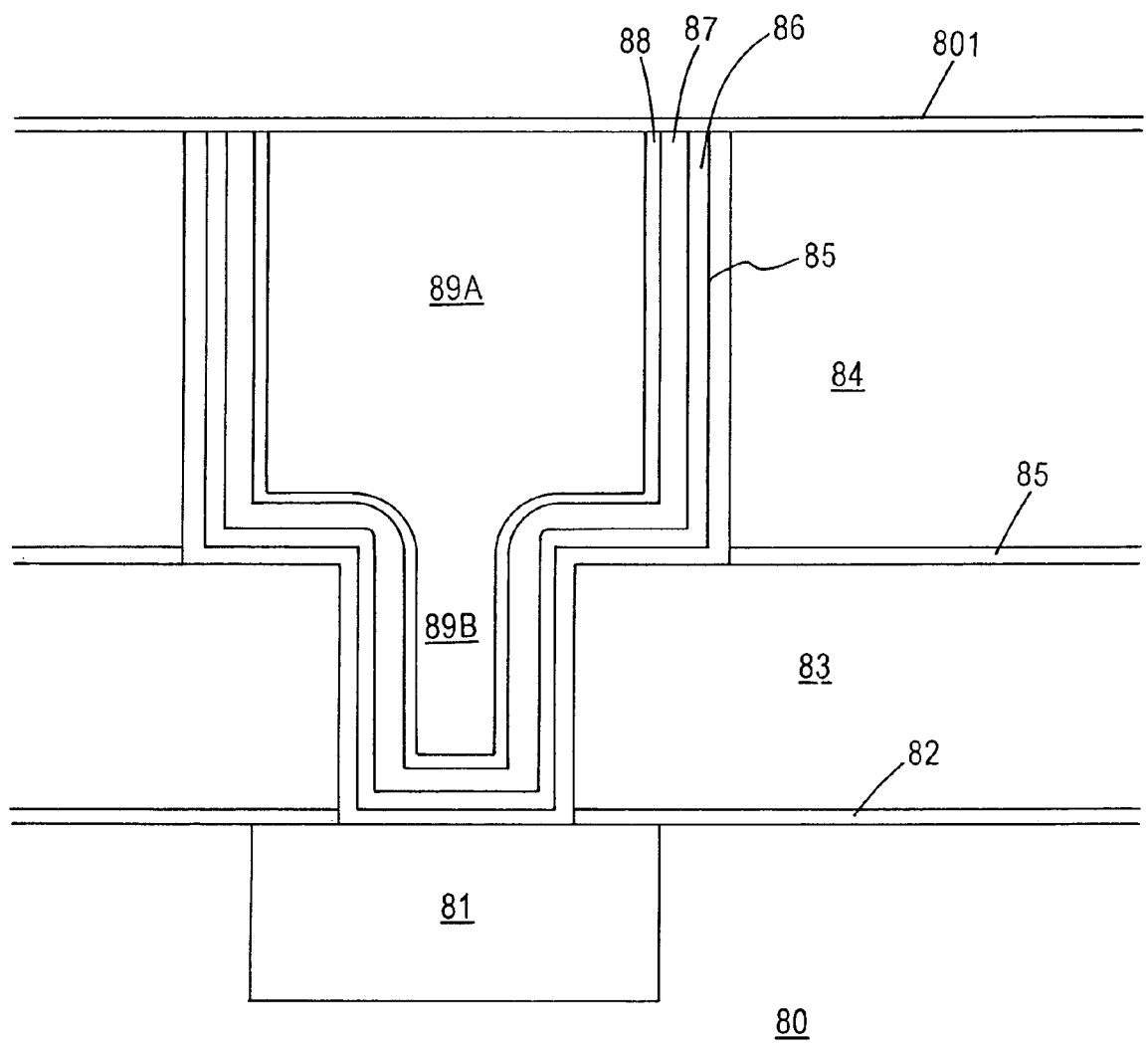
FIG. 5 through illustrates a dual damascene embodiment in accordance with the present invention.

The embodiment illustrated in FIGS. 2 through 4 relates to a single damascene structure. However, it should be understood that the present invention is also applicable to dual damascene structures. For example, a dual damascene structure formed with the three barrier layer composite embodiment of the present invention is schematically illustrated in FIG. 5, wherein a lower metal feature 81, e.g., a Cu line, is formed in an underlying dielectric layer containing a low-k dielectric material. Also illustrated in FIG. 5 is a capping layer 82, such as silicon nitride or silicon carbide, dielectric layer 83 and dielectric layer 84 separated by middle etch stop layer 85, such as silicon nitride or silicon carbide. A dual damascene opening is formed by any conventional technique, such as a via first-trench last or trench first-via last technique. An initial layer of TaN 85 is deposited by ISD followed using a $N_2$ flow sufficient to poison the Ta target. After depositing initial TaN layer 85, the $N_2$ flow is discontinued and ISD continued using the N2-poisoned Ta target to sequentially deposit graded tantalum nitride layer 86 and α-Ta layer 87. A seedlayer 88 can then be deposited followed by Cu deposition, e.g., electroplating or electroless deposition, and CMP to form Cu line 89A connected to Cu via 89B which is in electrical contact with underlying metal feature 81. A capping layer 801, such as silicon nitride or silicon carbide, is then deposited to complete the interconnect structure illustrated in FIG. 5. The nitrogen flow rate during deposition of the initial TaN layer and/or ratio of the thickness of the combined α-Ta and graded tantalum nitride layers to the thickness of the initial TaN layer are controlled such that the exposed surface of the α-Ta layer has an average surface roughness (Ra) of about 25 Å to about 50 Å, thereby significantly reducing Cu diffusion at the Cu/composite barrier layer interface while preventing shadowing. The resulting structure exhibits improved electromigration resistance and device reliability.

In implementing various damascene techniques in accordance with embodiments of the present invention, Cu can be deposited by electroless deposition or electroplating using a seed layer. Typical seed layers include Cu alloys containing magnesium, aluminum, zinc, zirconium, tin, nickel, palladium, silver or gold in a suitable amount, e.g., about 0.3 to about 12 at. %. CMP is then performed such that the upper surface of the inlaid Cu is substantially coplanar with the upper surface of the interlayer dielectric.

In accordance with embodiments of the present invention, the damascene opening can also be filled with Cu by PVD at a temperature of about 50° C. to about 150° C. or by CVD at a temperature under about 200° C. In various embodiments of the present invention, conventional substrates and interlayer dielectrics, can be employed. For example, the substrate can be doped monocrystalline silicon or gallium-arsenic. The interlayer dielectric employed in the present invention can comprise any dielectric material conventionally employed in the manufacture of semiconductor devices. For example, dielectric materials such as silicon dioxide, phosphorous-doped silicate-glass (PSG), boron-and phosphorus doped silicate glass (BPSG), and silicon dioxide derived from tetraethylorthosilicate (TEOS) or saline by PECVD can be employed. The openings formed in dielectric layers are effected by conventional photolithographic and etching techniques.

Advantageously, dielectric materials for use as interlayer dielectrics in accordance with embodiments of the present invention can comprise dielectric materials with lower values of permitivity and those mentioned above, in order to reduce interconnect capacitance. The expression "low-k" material has evolved characterized materials with a dielectric constant less than about 3.9, e.g., about 3.5 or less. The value of a dielectric constant expressed herein is based upon the value of (1) for a vacuum.

A wide variety of low-k materials can be employed in accordance with embodiments of the present invention, both organic and inorganic. Suitable organic materials include various polyimides and BCB. Other suitable low-k dielectrics include poly(arylene)ethers, poly(arylene)ether azoles, parylene-N, polyimides, polynapthalene-N, polyphenylquinoxalines (PPQ), polyphenyleneoxide, polyethylene and polypropylene. Other low-k materials suitable for use in embodiments of the present invention include $FO_x$™ (HSQ-based), XLK™ (HSQ-based), and porous SILK™, an aromatic hydrocarbon polymer (each available from Dow Chemical Co., Midland, Mich.); Coral™, a carbon-doped silicon oxide (available from Novellus Systems, San Jose, Calif.), silicon-carbon-oxygen-hydrogen (SiCOH) organic dielectrics, Black-Diamond™ dielectrics, Flare™, an organic polymer, HOSP™, a hybrid sioloxane-organic polymer, and Nanoglass™, a nanoporous silica (each available from Honeywell Electronic Materials) and halogen-doped (e.g., fluorine-doped) silicon dioxide derived from tetraethyl orthosilicate (TEOS) and fluorine-doped silicate glass (FSG).

The present invention enables the manufacture of semiconductor devices having Cu interconnects with improved electromigration resistance, enhanced reliability and reduced contact resistance and improved wafer-to-wafer uniformity, by controlling the roughness at the Cu/composite barrier layer interface. The formation of a composite barrier layer comprising α-Ta graded tantalum nitride and TaN also avoids adhesion problems attendant upon conventional practices, thereby further increasing device reliability and improving electromigration resistance, and also reduces contact resistance.

The present invention enjoys industrial applicability in the formation of various types of inlaid Cu metallization interconnection patterns. The present invention is particularly applicable to manufacturing semiconductor devices having submicron features and high aspect ratio openings.

In the previous description, numerous specific details are set forth, such as specific materials, structures, chemicals, processes, etc., to provide a better understanding of the present invention. However, the present invention can be practiced without resorting to the details specifically set forth. In other instances, well known processing and materials have not been described in detail in order not to unnecessarily obscure the present invention.

Only the preferred embodiment of the present invention and but a few examples of its versatility are shown and described in the present invention. It is to be understood that the present invention is capable of use in various other combinations and environments and is capable of changes or modifications within the scope of the inventive concept as expressed herein.

What is claimed is:

1. A method of manufacturing a semiconductor device, the method comprising:
   forming an opening in a dielectric layer over a semiconductor wafer;
   forming a composite barrier layer with an exposed surface having an average surface roughness (Ra) of about 25 Å to about 50 Å lining the opening, the composite barrier layer comprising a layer of α-tantalum (α-Ta) over an initial layer of tantalum nitride (TaN); and
   filling the opening with copper (Cu) or a Cu alloy.

2. The method according to claim 1, further comprising:
   depositing a graded tantalum nitride layer on the initial TaN layer lining the opening; and
   depositing the α-Ta layer on the graded tantalum nitride layer.

3. The method according to claim 2, comprising:
   depositing the TaN layer by ionized sputter deposition using a Ta target and a sufficiently high nitrogen ($N_2$) flow rate to poison the Ta target with $N_2$;
   discontinuing the flow of $N_2$; and
   depositing the graded tantalum nitride and α-Ta layers using the Ta target.

4. The method according to claim 2, comprising:
   depositing the TaN layer using a nitrogen ($N_2$) flow rate; and
   controlling the surface roughness (Ra) by varying:
   a) the ratio of the thickness of the combined α-Ta and graded tantalum nitride layers to the thickness of the initial TaN layer; and/or
   b) the $N_2$ flow rate during deposition of the TaN layer.

5. The method according to claim 4, comprising:
   varying the ratio between about 50 to about 250.

6. The method according to claim 4, comprising varying the $N_2$ flow rate between about 10 to about 100 sccm.

7. The method according to claim 2, wherein the opening is formed in dielectric material having dielectric constant less than about 3.9.

8. The method according to claim 7, wherein the opening is a dual damascene opening, the method comprising filling the dual damascene opening to form a lower Cu or Cu alloy via in electrical contact with a lower metal feature and connected to an upper Cu or Cu alloy line.

* * * * *